(12) United States Patent
Nakanishi et al.

(10) Patent No.: US 9,226,431 B2
(45) Date of Patent: Dec. 29, 2015

(54) CAST HOUSING FOR A CONFIGURABLE POWER CONVERTER

(71) Applicant: Caterpillar Inc., Peoria, IL (US)

(72) Inventors: Todd Nakanishi, Brimfield, IL (US); Jon Husser, McNabb, IL (US); Timothy Finn, Peoria Heights, IL (US)

(73) Assignee: Caterpillar Inc., Peoria, IL (US)

( * ) Notice: Subject to any disclaimer, the term of this patent is extended or adjusted under 35 U.S.C. 154(b) by 198 days.

(21) Appl. No.: 14/132,363

(22) Filed: Dec. 18, 2013

(65) Prior Publication Data

US 2015/0173244 A1    Jun. 18, 2015

(51) Int. Cl.
*H05K 7/20* (2006.01)
*H05K 7/14* (2006.01)

(52) U.S. Cl.
CPC .......... *H05K 7/20927* (2013.01); *H05K 7/1432* (2013.01); *H05K 7/20972* (2013.01)

(58) Field of Classification Search
CPC .......................... H05K 7/1432; H05K 7/20927
See application file for complete search history.

(56) References Cited

U.S. PATENT DOCUMENTS

| | | | |
|---|---|---|---|
| 6,026,643 A * | 2/2000 | Kullmann et al. | 60/533 |
| 7,505,294 B2 | 3/2009 | Ahmed et al. | |
| 7,952,876 B2 | 5/2011 | Azuma et al. | |
| 7,978,471 B2 | 7/2011 | Tokuyama et al. | |
| 8,467,188 B2 * | 6/2013 | Hsieh et al. | 361/698 |
| 2006/0007720 A1 | 1/2006 | Pfeifer et al. | |
| 2010/0165575 A1 | 7/2010 | Husser et al. | |
| 2010/0232111 A1 | 9/2010 | Baker et al. | |
| 2011/0249421 A1 | 10/2011 | Matsuo et al. | |
| 2012/0039039 A1 | 2/2012 | Nishikimi et al. | |
| 2013/0058068 A1 | 3/2013 | Funatsu | |
| 2015/0010392 A1 * | 1/2015 | Lazich et al. | 415/170.1 |
| 2015/0165929 A1 * | 6/2015 | Nakanishi et al. | 1/1 |
| 2015/0173238 A1 * | 6/2015 | Nakanishi et al. | 1/1 |

FOREIGN PATENT DOCUMENTS

| | | | |
|---|---|---|---|
| DE | 102011121064 A1 * | 6/2013 | H05K 7/20 |
| JP | 2012146759 | 8/2012 | |
| JP | 2013094022 | 5/2013 | |

* cited by examiner

*Primary Examiner* — Robert J Hoffberg
(74) *Attorney, Agent, or Firm* — Glenn Waterfield

(57) ABSTRACT

A casting for a housing for a flexible, configurable power converter is disclosed. The housing includes a power compartment that is configured to accept a heat sink in either of two orientations. The configurable nature of the power converter allows the same power convertible package to be used in a number of applications without having to incur the cost of developing a new power converter package.

12 Claims, 10 Drawing Sheets

FIG. 7

| Config # | Inverter Topology | Element | AC I/O | Terminal Block Lugs | AC Bus Bar Terminals | AC I/O Direction | DC I/O | Coolant I/O | Control I/O | Gate drive | Accessory I/O |
|---|---|---|---|---|---|---|---|---|---|---|---|
| 1-14 | SR Dual | 240 | 12 | 3 | 4 | Front, Back, Bottom | None, Left, Right, or Both | Left or Right | Left or Right | Single | None, Left, or Right |
| 15-28 | AC Dual | 250 | 6 | 3 | 2 | Front, Back, Bottom | None, Left, Right, or Both | Left or Right | Left or Right | Single | None, Left, or Right |
| 29-42 | SR/AC Dual | 260 | 9 | 3 | 4,3,2 | Front, Back, Bottom | None, Left, Right, or Both | Left or Right | Left or Right | Single | None, Left, or Right |
| 43-55 | SR Parallel | 270 | 6 | 2 | 2 | Front, Back, Bottom | Left, Right, or Both | Left or Right | Left or Right | Parallel | None, Left, or Right |
| 56-68 | SR Parallel | 280 | 12 | 4 | 4 | Front, Back, Bottom | Left, Right, or Both | Left or Right | Left or Right | Parallel | None, Left, or Right |
| 69-81 | AC Parallel | 290 | 3 | 3 | 1 | Front, Back, Bottom | Left, Right, or Both | Left or Right | Left or Right | Parallel | None, Left, or Right |
| 82-94 | AC Parallel | 300 | 6 | 2 | 2 | Front, Back, Bottom | Left, Right, or Both | Left or Right | Left or Right | Parallel | None, Left, or Right |

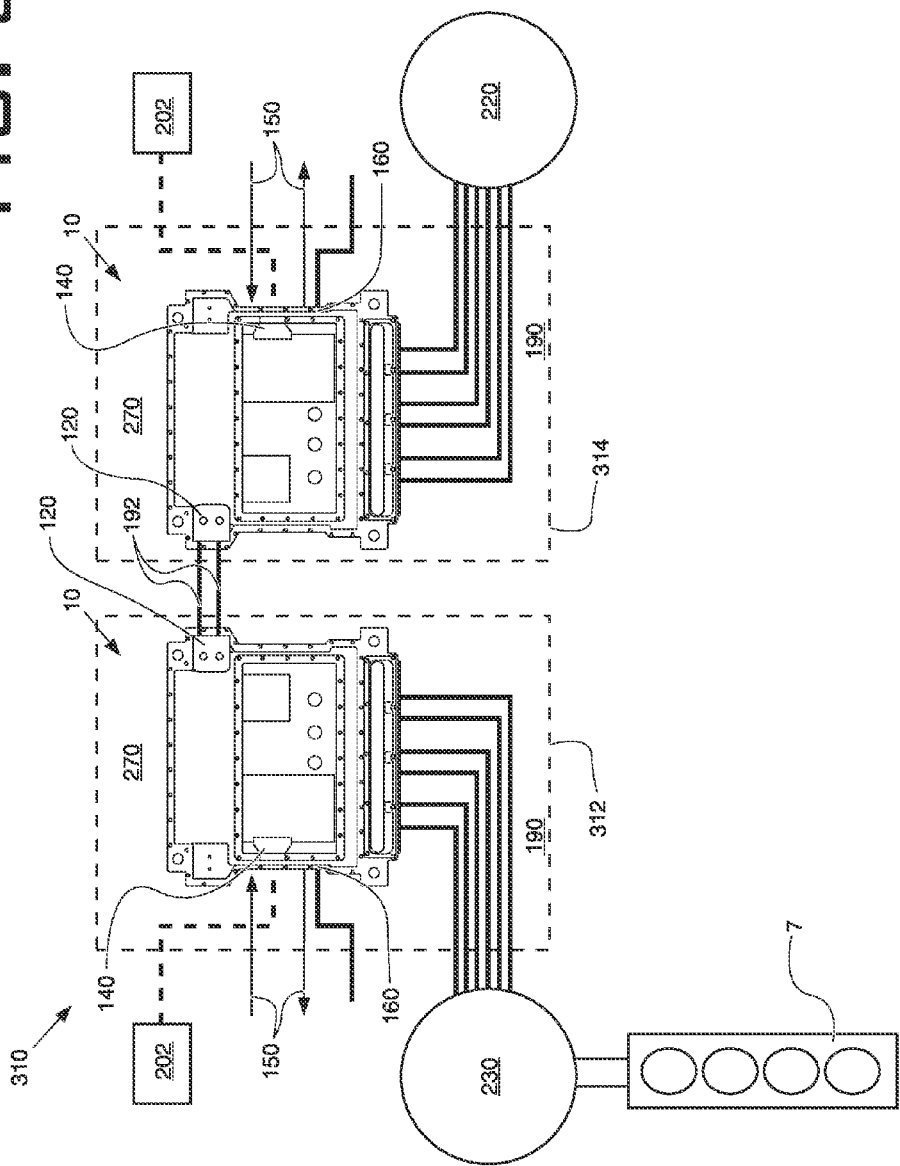

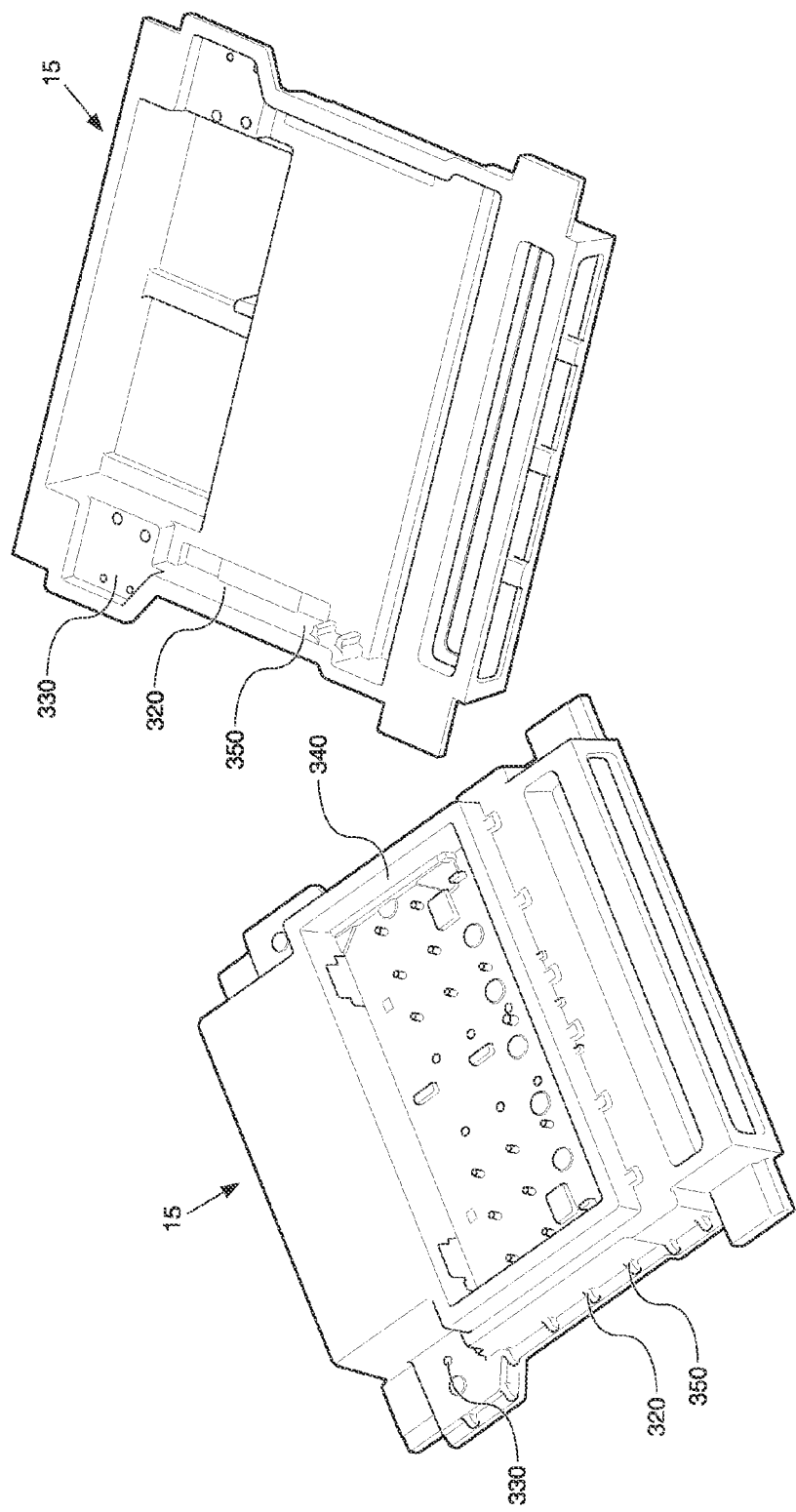

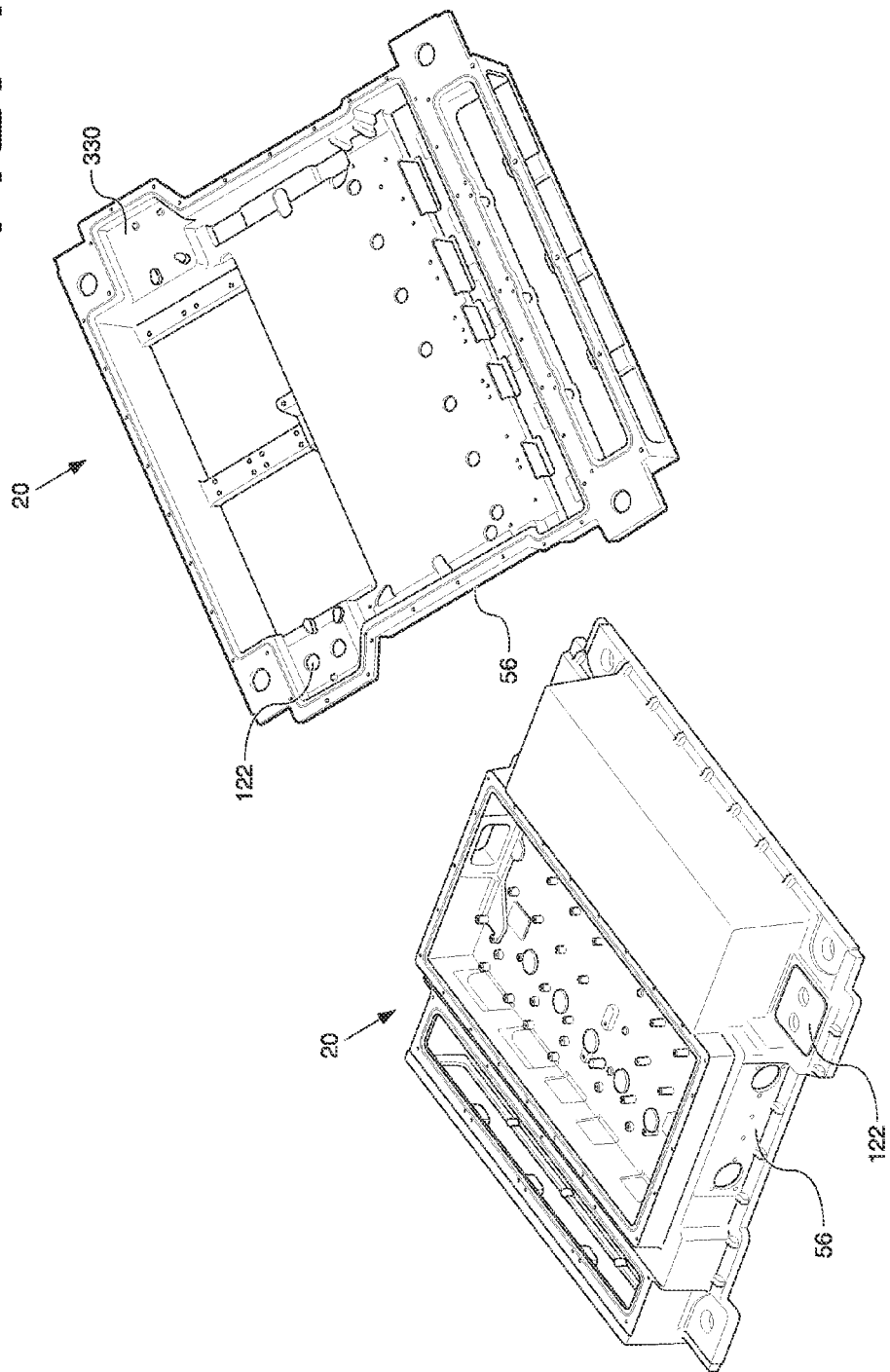

CAST HOUSING FOR A CONFIGURABLE POWER CONVERTER

TECHNICAL FIELD

The present disclosure relates to a flexible design of a casting for a housing of a power converter. The flexible design allows for the power converter to support the drivetrain needs of a product line of machines without having to design and tool a new casting for each application.

BACKGROUND

Power converters are commonly used to convert AC power from a generator to DC power, and then from DC power to AC power for use by a motor. Power conversion may require high-speed switching of large currents by power semiconductor devices, such as insulated gate bipolar transistors (IGBTs). An electric drive traction application typically includes both AC/DC conversion to receive power from a generator and DC/AC conversion to power a motor. The generator is typically driven by an engine.

Different power converter applications may also have different requirements for locations of external connections. Such connections may include DC connections, AC connections, coolant connections, control connections, and accessory connections. Power converters may be used in different locations on a machine, and each location may require different locations for the connections. For example, a power converter may be connected to a generator or a motor, each of which is located on a different part of the machine. Likewise, if the machine has two or more drive motors, a power converter may require different locations for the connections. For example, motors on the front and rear or left and right sides of the machine may require connection locations that are mirror images of the other. This would normally require a new power converter to be developed for each location.

The cost of designing a power converter is considerable. Significant engineering time is required for proper bus bar routing, board layouts, housing design, and power module design. The design cost for power modules is particularly high. Tooling is also an important consideration. For example, the tooling for a single housing design can be in excess of $100,000. Each time a new power converter is designed for a new application, new tooling is needed. Typically, a single housing design cannot be used for different power converter designs.

Accordingly, the power converter is a significant portion of an electric drivetrain cost. Production volumes are needed to drive down costs in order to make electric drivetrains feasible for more applications in a product line. Therefore it is desirable to design a power converter package that can be adapted to a large number of configurations while changing a minimum number of components. Thus, the power converter design can fulfill the needs of an entire product line of electric drivetrains thereby saving NRE and tooling costs associated with creating new designs for every application.

United States Patent Application No. 20060120001 to Weber et al., issued Jun. 8, 2006, entitled "Modular power supply assembly," known hereafter as the Weber Reference. The Weber Reference discloses "A modular power converter that is easily adapted to a wide variety of applications . . . . " However, The Weber Reference takes a very different approach from the current disclosure and states that "A fundamental approach of the present design is to separate the typical drive inverter and converter design functions of a power converter into separate assemblies." Different parts of the chassis or housing are changed out in order to adapt to different applications. The number of different parts requires a large number of designs in order to meet the needs of those applications. In addition, the heat sink design disclosed by Weber et al. does not account for coolant connections from different sides of the power converter.

SUMMARY OF THE INVENTION

A casting for a power converter housing is disclosed. The casting comprises a front side, a back side which is opposite from the front side and has a power compartment, a top side, and a bottom side which is opposite from the top side. The casting further comprises a right side a left side opposite from the right side. A power compartment is located on said back side, having a recess configured to receive a heat sink mounted in one of two orientations. The heat sink comprises a first end and a second end, the first end having coolant ports configured to receive coolant, a set of mounting features configured to align with a set of mounting holes in the casting when mounted in either of two orientations. The casting further comprises a first heat sink orientation that provides coolant ports on the right side of said housing and a second heat sink orientation provides coolant ports on the left side of said housing.

BRIEF DESCRIPTION OF THE DRAWINGS

FIG. 7 is a configuration table according to the current disclosure FIG. 8 is a drivetrain configuration according to the current disclosure FIG. 9 shows casting features included on casting according to the current disclosure FIG. 10 shows features included on a housing according to the current disclosure

DETAILED DESCRIPTION

Figure 1:
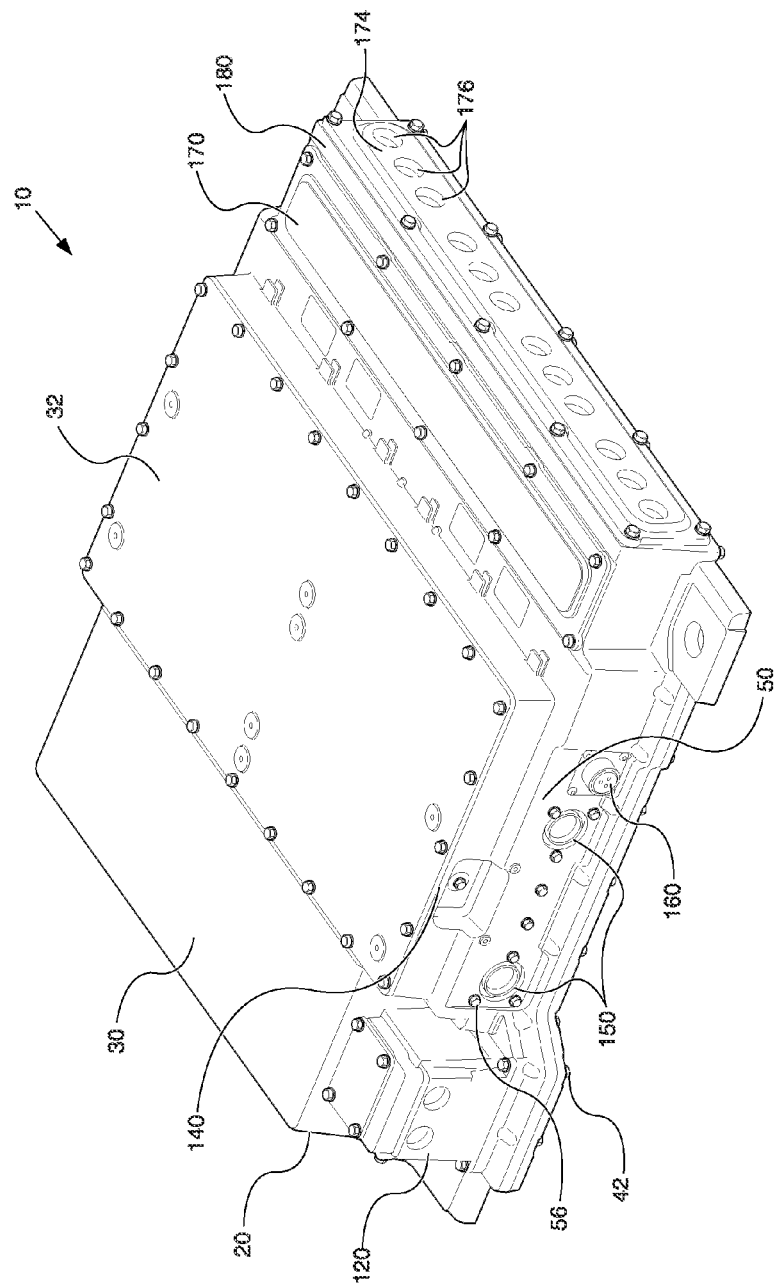
FIG. 1 is a perspective view of a housing according to the current disclosure
Figure 2:
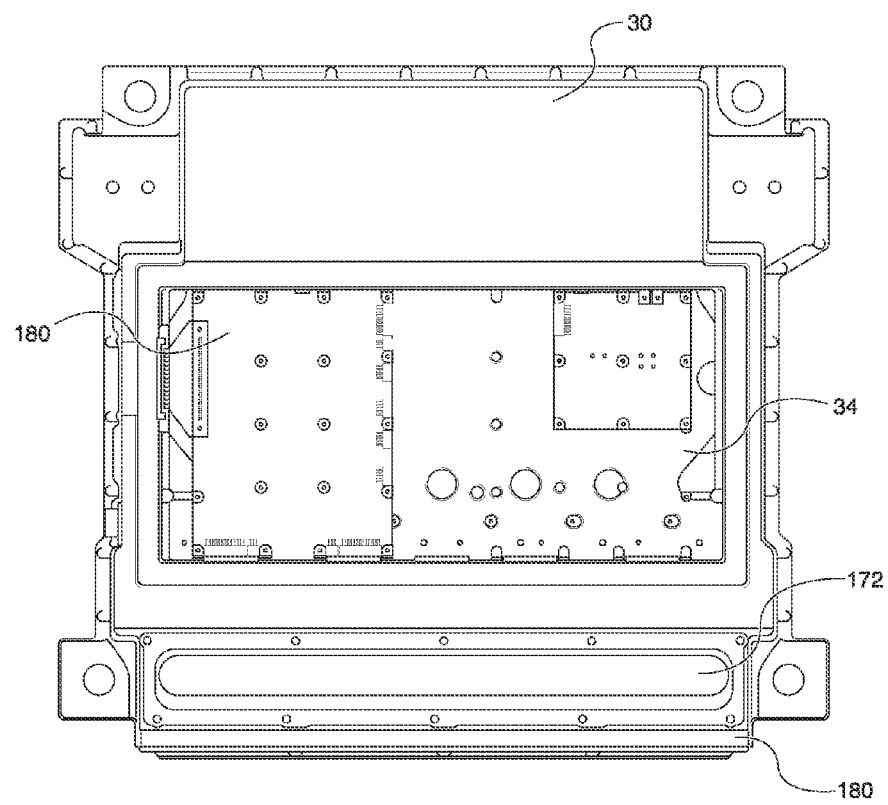
FIG. 2 is a front view of a housing according to the current disclosure
Figure 3:
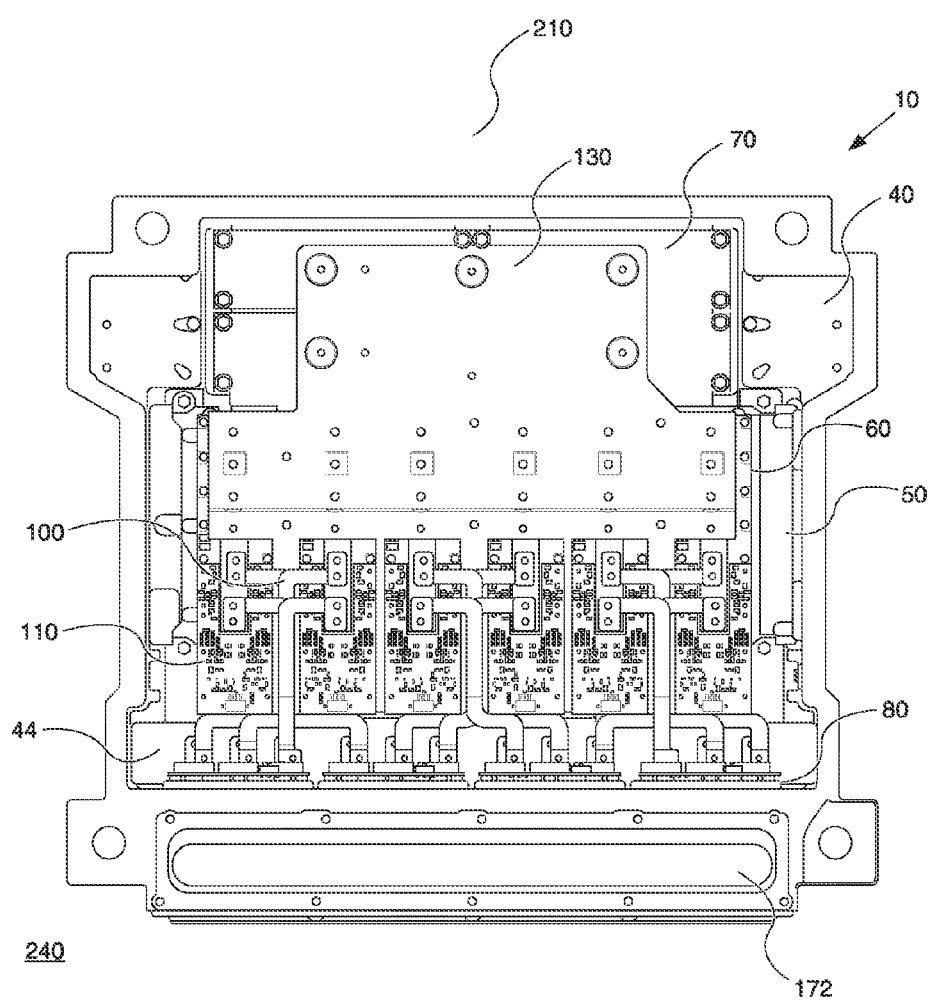
FIG. 3 is a back view of a housing according to the current disclosure
Figure 4:
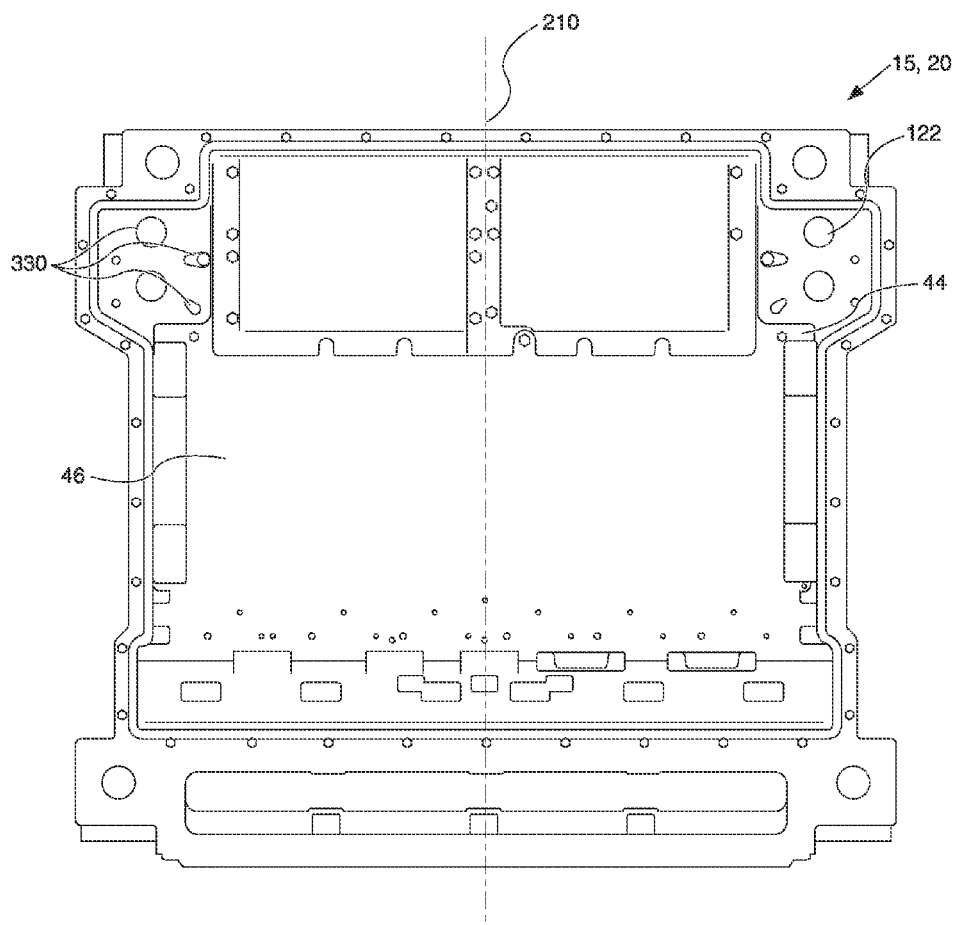
FIG. 4 is a back view of a housing according to the current disclosure
Figure 5:
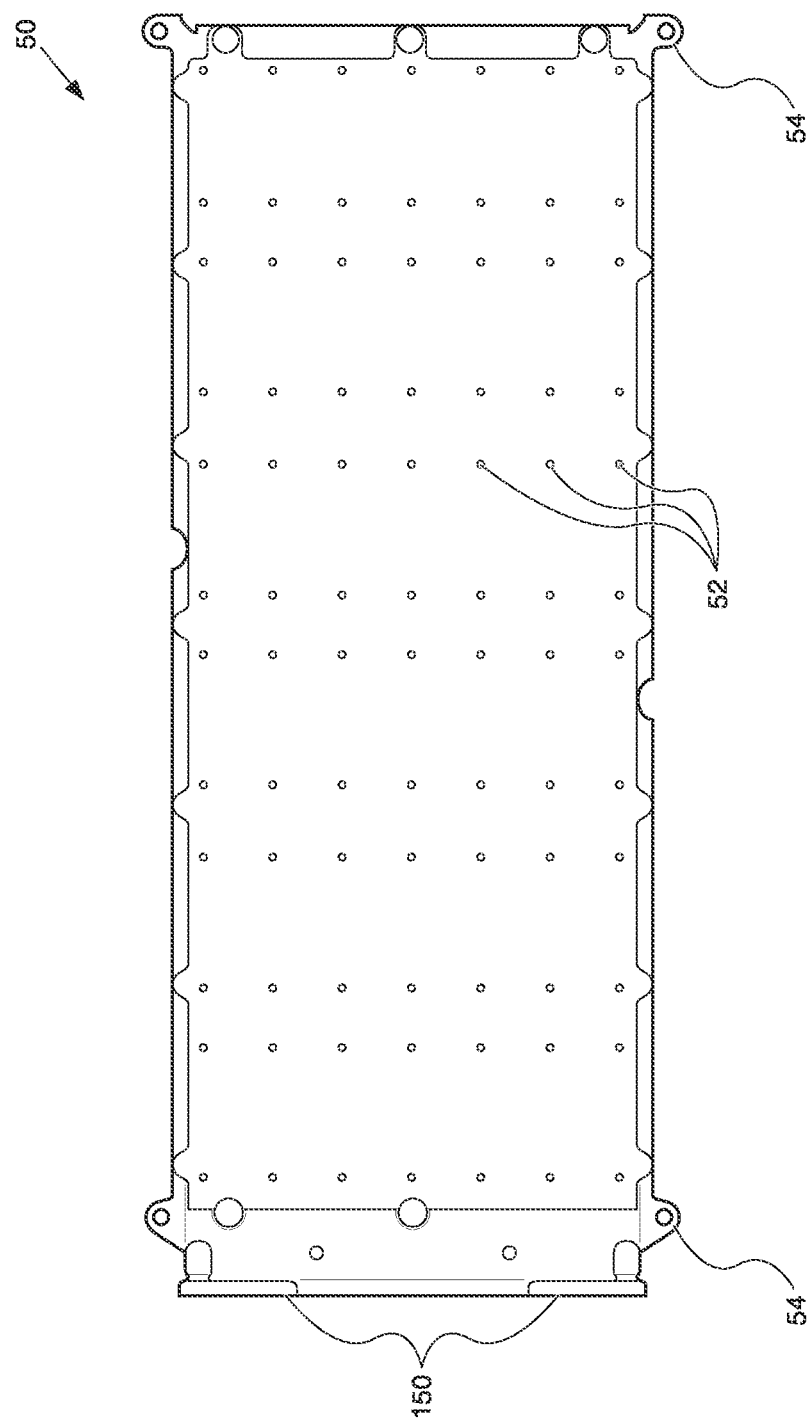
FIG. 5 is a view of a heat sink according to the current disclosure
Figure 6:
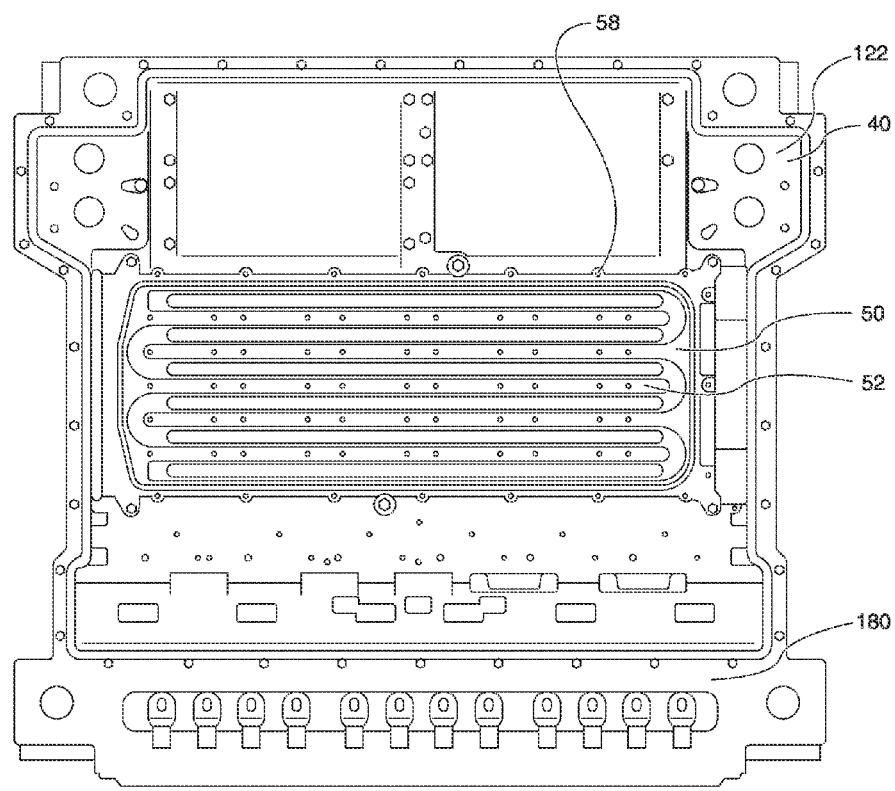
FIG. 6 is a view of a heat sink mounted to a housing according to the current disclosure

The power converter package 10 includes a housing 20. The housing is made of metal and is cast and/or machined. The housing has a front 30 and a front cover 32 that covers a front compartment 34. The front compartment 34 contains an interface board 200 that connects to a controller 202 through a controls connector 140. The interface board 200 provides signal processing between the controller 202 and the gate drive boards 110 and sensors, etc. in the power converter package 10. The housing 20 includes provisions to allow the controls connector 140 be mounted on either of the left or right sides. The housing 20 also includes provisions to allow a DC connection box to be mounted on either of the left or right sides.

The housing 20 also has a back 40 and a back cover 42 that covers a back compartment 44. The back compartment 44 has provisions for mounting a filter capacitor 70, a heat sink 50, an accessory connector 160. The housing 20 includes provisions to allow the accessory connector 160 mounted on either of the left or right sides.

Provisions are included in the housing 20 that allow the DC connection box 120, controls connector 140, the accessory connector 160 to be mounted on either the left or right side. For instance, casting features 330 such as mounting bosses are included on both left and right sides to allow mounting of the DC connection box 120. Finish machining, drilling, and tapping may then be performed in either location depending on where the DC connection box 120 needs to be mounted for a particular application. Casting features 330 are also provided to allow for a DC connection aperture 122 in the casting 15 in order to allow DC connections to pass from the DC access bar 130 to the DC connection box 120. The application may require one, two, or no DC connection boxes 120. Casting features 340 that provide for controls connector 140 includes a flat that can be machined and mounting bosses to allow mounting on either the left or right side. Similarly, casting features 350 are provided for the accessory connector 160 to be mounted on either the left or right side.

The housing 20 includes an AC connection compartment 180 at one end. The AC connection compartment 180 provides access for AC power connection from outside the housing 20 to the components inside the housing 20. Connections are provided via lug-and-gland type connectors from the AC cables 190 to a terminal block 80. Access is provided by a front AC connection plate 170, a back AC connection plate 172, and a bottom AC connection plate 174. The AC connection plates are attached to the housing 20 via mounting flanges. Any of the AC connection plates can be configured with cable apertures 176 to allow AC cables 190 to pass through. In this fashion, AC cables 190 may be routed to the power converter package 10 from the front, back or bottom.

The heat sink 50 bolts to the housing 20 inside the housing back compartment 44. The housing back compartment 44 includes a recess 46 configured to accept the heat sink 50. One surface of the heat sink 50 is machined flat and includes power module mounting holes 52 for mounting a plurality of power modules 60. Coolant passages are provided that route through the heat sink 50 to remove heat generated by the power modules 60. The heat sink 50 and housing 20 are configured such that the heat sink 50 can be mounted with the coolant inlet/outlet connections 150 on either of the left or right side. The housing 20 includes a housing interface 56 that is added to accommodate the end of heat sink 50 and provide apertures for coolant inlet/outlet connections 150. The casting 15 includes a first casting feature 320 that allows the housing interface 56 to be located on either of the left or right sides of the casting 15.

The heat sink includes mounting features or mounting holes 54 for the bolts that attach the heat sink 50 to the housing 20 are arranged in symmetry about the left-right axis 210 allowing the heat sink 50 to be attached to the housing in either of two orientations. In this way, the power converter package 10 can provide coolant inlet/outlet connections 150 on either the left or right side while using the same housing 20 and heat sink 50. In one aspect of the current disclosure, the power module mounting holes 52 that attach the power modules 60 to the heat sink 50 are configured with a symmetry about the left-right axis 210 of the power converter package 10, allowing proper mounting of the power modules 60 in either mounting configuration. In another aspect of the current disclosure, the power module mounting holes 52 located in the heat sink 50 are symmetric about a left-right axis of the heat sink 50.

The power modules 60 typically include paired silicon-based insulated gate bipolar transistors (IGBTs) and fly-back diodes. The IGBTs are enclosed in a case and electrically connected to connection terminals. Connection terminals are also included for connection of the IGBT gates to a gate drive board 110. A backing plate is thermally connected to the IGBTs and diodes. Heat generated by the IGBTs during switching is conducted through the backing plate and into the heat sink 50 where it can be removed by circulating coolant. Mounting holes are provided through the case and backing plate for mounting the power modules 60 to the heat sink 50.

The power converter package 10 according to the present disclosure is designed to work with either induction/PM or switched reluctance (SR) technology. Induction/PM and SR technology require power modules 60 with different configurations. An induction/PM power module 62 is configured with both IGBTs in series. Three induction/PM power modules 62 in a power module set 66 are typically used to provide three-phase AC that connects to a stator winding of an induction/PM machine such as a motor or generator. An SR power module 64 is configured with both IGBTs in parallel and provides power for one stator winding of an SR machine such as a motor or generator. SR power modules 64 in a power module set 66 can be combined to provide AC power to multi-phase SR machines.

Though possible, it is inefficient from a space and cost perspective to use an induction/PM configuration to power an SR machine. As such, power converters are not typically designed to accommodate both induction/PM and SR technology. A power converter package 10 that can accommodate both induction/PM and SR technology would require a power module 60 that is available in both induction/PM and SR configurations. This power module 60 is available as an induction/PM power module 62 and an SR power module 64 and is available exclusively from Infineon Industrial Power Division of Lebanon, N.J. The induction/PM power module 62 and SR power module 64 have identical mounting and DC connection configurations and are therefore mechanically interchangeable save for the start/finish and AC connections. Filter capacitors 70 are mounted in the housing back compartment 44 and are electrically connected to the DC bus bar 90 via screw terminals. The mounting arrangement of the filter capacitors 70 is designed to accommodate high vibration environments. The filter capacitors 70 provide bulk capacitance that is needed to dampen ripple current that occurs on the DC link that connects the power converter package 10 to loads or different power conversion stages. The bulk capacitance also serves to filter out harmonic content and voltage spikes of the DC link voltage. Film capacitors are often the preferred choice for mobile applications and can be packaged and mounted in a variety of ways.

The power converter package 10 includes a terminal block 80 that connects the AC bus bars 100 to the AC cables 190. Connecting lugs on the terminal block 80 extend into the AC connection compartment 180 where they connected to the AC cables 190 via lug-and-gland style connections. The terminal block 80 includes a printed circuit board (PCB) with a soldered hall-effect current sensor and a plastic isolator with conductors. The pieces are assembled together as a sub-assembly and then assembled into the power converter package 10. The assembly is capable of conducting and sensing current for any number of conductors as needed for the power converter application. The combination of hall-effect sensor and conductor assembly results in a smaller and less expensive solution than the industry standard approach.

The terminal block 80 is designed in configurations with two, three, or four connector lugs. The three configurations or combinations of the three configurations of terminal blocks 80 is sufficient to meet all the required applications of the power converter package.

The DC bus bar 90 connects the positive and negative DC terminals of the power module 60 to the respective terminals of the filter capacitor 70. The DC bus bar 90 is formed by laminating two conductors together, where each of the conductors is individually insulated from the other conductor.

Provisions to connect to the DC bus bar 90 to an accessory connector 160 and a DC access bar 130 are provided. Said provisions can be in the form of threaded terminals, crimp lugs, or the like. The DC bus has properties of symmetry about the left-right axis 210 and has provisions to connect to the DC bus bar 90 to an accessory connector 160 and a DC access bar 130 on the left and right side.

The DC access bar 130 is a two conductor laminated bus bar that connects the DC bus bar 90 to the DC connection box 120. A first end of the DC access bar 130 can connect to the DC bus bar 90 in either of two locations. The second end of the DC access bar 130 connects to a DC terminal block that is mounted to the bottom of the DC connection box 120. The DC access bar has properties of symmetry and is designed to connect to the DC connection box 120 whether the DC connection box 120 is mounted on the left or the right side of the housing 20.

The DC connection box 120 is a connection box that can be located on either the left, right, or both sides of the housing 20. The DC connection box 120 provides access for DC power connection from outside the housing 20 to the components inside the housing 20. The DC connection box 120 includes a DC terminal block that is mounted to the housing at the base of the DC connection box and is electrically connected to the DC access bar 130. Connections are provided via lug-and-gland type connectors from the DC cables 192 to the DC terminal block. In some applications, an external DC bus bar may be used instead of DC cables 192.

The gate drive board 110 is configured to take commands from a controller 202 through the interface board 200 and generate switching commands for the power modules 60. Switching commands are given to the power modules 60 via connectors carrying control-level voltage signals. The gate drive board 110 of the current disclosure is designed in two configurations. The first configuration supports a single power module 60. The second configuration supports two power modules 60 that are connected in parallel. Either configuration is able to support an induction/PM power module 62 or an SR power module 64.

The power converter package 10 of the current disclosure is designed to be adapted to a large number of configurations while changing a minimum number of components. The power converter package 10 is therefore configurable to fulfill the needs of an entire product line of electric drivetrains 310 and the need to design and pay for tooling all new components for each application is avoided.

For example, the housing 20, heat sink 50, filter capacitor 70, and DC bus bar 90 are common between every power converter package 10 configuration. In addition, only one power module 60 footprint serves all power converter package 10 configurations.

Symmetry is a major theme among many components, including the housing 20, heat sink 50, power module 60, DC bus bar 90, DC connection box 120, and DC access bar 130. Symmetry in shape and mounting configuration allows such components to be mounted in different locations within the power converter package 10 or able to be combined with different versions of other components without modification.

The table in FIG. 7 shows the configurations that are able to be satisfied by the power converter package 10, including the topologies, and major components. The major topologies will be briefly described below.

FIG. 9 shows various casting features of the casting 15. FIG. 10 shows the housing 20 after several machining operations.

INDUSTRIAL APPLICABILITY

The power converter package 10 of the current disclosure is designed to be adapted to a large number of configurations while changing a minimum number of components. The power converter package 10 is therefore configurable to fulfill the needs of an entire product line of electric drivetrains 310 for providing tractive effort on a machine 5. This saves NRE and tooling costs associated with creating new designs for every application. Further, using a single power converter package 10 across an entire product line increases volume which lowers the cost of the power converter package 10 by diluting the NRE and tooling costs over a larger volume. Since the power converters can be a significant portion of the cost of an electric drivetrain 310, this allows electric drivetrains 310 to be incorporated in more applications.

To this end, the housing 20, heat sink 50, filter capacitors 70, and DC bus bar 90 are common between every configuration. In addition, the power converter package 10 is designed to use one power module 60 footprint that supports both SR and induction/PM technology. This capability allows the power converter package 10 to connect to either an SR or induction/PM motor or generator while changing a minimum number of components.

FIG. 8 shows another example of an electric drivetrain 310 according to the present disclosure. The power converter packages 10 shown are of the type SR Parallel Topology 270. The first power converter package 10 is connected to an SR generator 230 by a first set of six AC cables 190. The generator 230 is driven by a prime mover such as an internal combustion engine. The AC cables 190 from the generator 230 are electrically connected to a first power module set 66 of six SR power modules 64 configured in parallel. An SR motor 220 is connected to a second power converter package 10 by a second set of six AC cables 190. The AC cables 190 from the motor 220 are electrically connected to a second power module set 66 of six SR power modules 64. The first and second power converter packages 10 are connected by DC cables 192. The electric drivetrain 310 is configured such that, in normal operation, power flows from the generator 230, through the first power converter package 10, to the second power converter package 10, and to the motor 220. The electric drivetrain 310 is configured such that power can also flow from the motor 220, through the second power converter package 10, through the first power converter package 10, and to the generator 230. The SR Dual Topology 270 as shown in FIG. 8 is typically rated for around 650 V dc and 1400 A rms.

The electric drivetrain 310 in FIG. 8 shows the DC connection box 120, the controls connector 140, the coolant inlet/outlet connections 150, and the accessory connector 160 on one side of the power converter packages 10. It should be understood that any of the preceding features could be located on either of the left or rights sides in any combination as required by the application. Further, the AC cables 190 could be routed to either the front, back or rear of the power converter package 10.

What is claimed is:
1. A casting for a power converter housing, comprising:
   a front side;

a back side, opposite from the front side, having a power compartment;

a top side;

a bottom side, opposite from the top side;

a right side;

a left side opposite from the right side;

the power compartment located on said back side, having a recess configured to receive a heat sink mounted in one of two orientations, said heat sink comprising:

a first end and a second end;

the first end having coolant ports configured to receive coolant;

a set of mounting features configured to align with a set of mounting holes in the casting when mounted in either of the two orientations;

wherein a first heat sink orientation of the two orientations provides the coolant ports on the right side of said housing and a second heat sink orientation of the two orientations provides the coolant ports on the left side of said housing.

2. The casting of claim 1 further comprising an interface on either of the left or right sides formed by a machining operation and configured to receive said first end.

3. The casting of claim 1 further comprising a first casting feature on either of the left or right sides formed to receive an interface formed by a machining operation and configured to receive said first end.

4. The casting of claim 1 further comprising a second casting feature on either of the left or right sides configured to accept a DC connection box.

5. The casting of claim 4 wherein the second casting feature is a boss configured to be drilled and tapped to accept a fastener.

6. The casting of claim 4 wherein the second casting feature is a flat configured to accept a DC connection aperture formed by a machining operation.

7. The casting of claim 1 further comprising a third casting feature on either of the left or right sides configured to accept a controls connector.

8. The casting of claim 7 wherein said controls connector is connected to an interface board that is mounted in a controls compartment located on said front side.

9. The casting of claim 1 further comprising a fourth casting feature on either of the left or right sides configured to accept an accessory connector.

10. The casting of claim 1 further comprising an AC connection compartment configured to orthogonally receive AC cables from either of the front, back or bottom sides.

11. The casting of claim 10 wherein the AC connection compartment further comprises a plurality of AC connection plates, one of which includes cable apertures configured to orthogonally receive the AC cables.

12. The casting of claim 1 wherein said casting possesses a symmetry about a left-right axis of the power converter housing.

* * * * *